(12) United States Patent  
Kobayashi

(10) Patent No.: US 8,264,897 B2  
(45) Date of Patent: Sep. 11, 2012

(54) SRAM AND METHOD FOR ACCESSING SRAM

(75) Inventor: Yasuo Kobayashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 235 days.

(21) Appl. No.: 12/782,490

(22) Filed: May 18, 2010

(65) Prior Publication Data

US 2010/0296354 A1 Nov. 25, 2010

(30) Foreign Application Priority Data

May 19, 2009 (JP) .................. 2009-120676

(51) Int. Cl.
  *G11C 7/00* (2006.01)
(52) U.S. Cl. ............... 365/203; 365/207; 365/226
(58) Field of Classification Search .......... 365/203, 365/207, 226, 154, 148
  See application file for complete search history.

(56) References Cited

U.S. PATENT DOCUMENTS 6,282,138 B1 * 8/2001 Wilkins ................. 365/207

FOREIGN PATENT DOCUMENTS

| JP | 2003-257182 A | 9/2003 |
|---|---|---|
| JP | 2007-164888 A | 6/2007 |

* cited by examiner

*Primary Examiner* — David Lam  
(74) *Attorney, Agent, or Firm* — Foley & Lardner LLP

(57) ABSTRACT

A static random access memory includes: a memory cell connected with a pair of bit lines and supplied with a power supply voltage from a first power supply; a precharge circuit configured to precharge the pair of bit lines with a precharge voltage; and a voltage reducing circuit including: a control circuit comprising a differential amplifier circuit configured to amplify a difference input of a reference voltage generated through resistance division of the power supply voltage and the precharge voltage supplied to a node to output a control signal; and a voltage reduction control transistor connected between the node and the first power supply and configured to generate the precharge voltage in response to the control signal. The precharge circuit includes: precharge transistors configured to control supply of the precharge voltage to the bit lines in response to a first precharge control signal.

15 Claims, 11 Drawing Sheets

SRAM AND METHOD FOR ACCESSING SRAM

INCORPORATION BY REFERENCE

This patent application claims a priority on convention based on Japanese Patent Application No. 2009-120676 filed on May 19, 2009. The disclosure thereof is incorporated herein by reference.

TECHNICAL FIELD

The present invention relates to an SRAM (static random access memory) and a method for accessing an SRAM, and more particularly, to an SRAM in which bit lines are precharged before accessing a memory cell.

BACKGROUND ART

In order to improve data reading and writing speeds, there is known a technique for precharging bit lines connected to a memory cell before accessing the memory cell.

FIG. 1 is a diagram illustrating a configuration of a conventional SRAM. Referring to FIG. 1, the conventional SRAM includes a plurality of memory cells (SRAM cells) 100 respectively connected to a plurality of word lines WL0 to WLi and a plurality of pairs of bit lines BL0 and /BL0 to BLj and /BLj. A precharge circuit 110 is connected between a power supply voltage Vcc and the plurality of pairs of bit lines BL0 and /BL0 to BLj and /BLj. The plurality of pairs of bit lines BL0 and /BL0 to BLj and /BLj are connected to a sense amplifier 13 and a write driver 14 through a bit line selecting section of bit line selection transistors MN11, MN12, MP16, and MP17 for each pair of bit lines. The precharge circuit 110 precharges the plurality of pairs of bit lines with the power supply voltage Vcc in response to a precharge control signal PC from a precharge (PC) driver 120. Specifically, the precharge circuit 110 is provided with precharge transistors MP23 and MP24 and equalizing transistor MP25 for each pair of bit lines and these transistors are controlled in response to the precharge control signal PC supplied to gates of the respective transistors. The precharge transistors MP23 and MP24 are P-channel MOS transistors that control a connection between the power supply voltage Vcc and each pair of bit lines in response to the precharge control signal PC. The equalizing transistor MP25 is a P-channel MOS transistor and controls a connection between the bit lines of each pair in response to the precharge control signal PC.

FIG. 2 shows timing charts in a data read operation on the memory cell of the conventional SRAM. Referring to FIG. 2, the data read operation on the memory cell 100 connected to the bit line pair BL0 and /BL0 and the word line WL0 will be described. Before the word line WL0 is activated, the precharge driver 120 outputs the precharge control signal PC in a low level to the precharge circuit 110. In response to the precharge control signal PC, the precharge circuit 110 supplies a precharge voltage of the power supply voltage Vcc (1.0 V in this case) to the pair of bit lines BL0 and /BL0, and also equalizes the pair of bit lines BL0 and /BL0. That is, before the activation of the word line WL0, the pair of bit lines BL0 and /BL0 are precharged to the power supply voltage Vcc (1.0 V).

When the word line WL0 is to be selected, the precharge driver 120 starts to increase a signal level of the precharge control signal PC prior to the activation of the word line WL0 (time T1). In response to the precharge control signal PC having the high level, the precharge circuit 110 sets the pair of bit lines BL0 and /BL0 into a floating state by disconnecting the power supply voltage Vcc from the pair of bit lines BL0 and /BL0. Then, the word line WL0 is activated by a word line driver (not shown) (time T2). While the word line WL0 is in an activation state, voltages on the pair of bit lines BL0 and /BL0 are detected by the sense amplifier 13 (time T3).

It is assumed that, in the memory cell 100, the bit line BL0 is connected to a node in the low level, and the bit line /BL0 is connected to a node in the high level. In this case, when the word line WL0 is activated, the voltage of the bit line BL0 reduces and a difference between the voltage on the bit line BL0 and the voltage (the power supply voltage Vcc) on the bit line /BL0 is sensed by the sense amplifier 13. Thus, a data having stored in the memory cell 100 can be determined. As described above, the data having stored in the memory cell 100 which is connected to the word line WL0 and the pair of bit lines BL0 and /BL0 is read.

After the data has been read, the word line WL0 is deactivated (time T4), and then the precharge driver 120 starts to decrease the signal level of the precharge control signal PC to the low level (time T5). In response to the precharge control signal PC in the low level, the precharge circuit 110 connects the power supply voltage Vcc and each pair of bit lines, and also equalizes the bit lines of each pair. Thus, each pair of bit lines is precharged to the power supply voltage Vcc (1.0 V). At this time, due to the equalizing operation at the time T5, the voltage on the bit line /BL0 connected to the node in the high level data is temporarily reduced, but then precharged to the power supply voltage Vcc with time.

FIG. 3 shows timing charts in a data write operation on the memory cell of the conventional SRAM. Referring to FIG. 3, the data write operation on the memory cell 100 connected to the pair of bit lines BL0 and /BL0 and the word line WL0 will be described. Before the word line WL0 is activated, the precharge driver 120 outputs the precharge control signal PC in the low level to the precharge circuit 110. In response to the precharge control signal PC in the low level, the precharge circuit 110 supplies the precharge voltage of the power supply voltage Vcc (1.0 V in this case) to each pair of bit lines, and also equalizes the bit lines of each pair. That is, before the activation of the word line WL0, the bit lines BL0 and /BL0 are precharged to the high level (power supply voltage Vcc: 1.0 V).

When the word line WL0 is selected, the precharge driver 120 starts to increase the signal level of the precharge control signal PC prior to the activation of the word line WL0 (time T1). In response to the precharge control signal PC in the high level, the precharge circuit 110 sets each pair of bit lines into the floating state to disconnect each pair of bit lines from the power supply voltage Vcc. Then, the word line WL0 is activated by a word line driver (not shown) (time T2), and a data is written in one memory cell by the write driver 14 (time T3). It is assumed that in the memory cell 100, a bit data in the high level is written to the node connected to the bit line BL0, and a bit data in the low level is written into the node connected to the bit line /BL0. In this case, the bit line BL0 becomes the high level (power supply voltage Vcc: 1.0 V), and the bit line /BL0 becomes the low level (ground voltage GND: 0 V).

After the data has been written, the word line WL0 is deactivated (time T4), and then the precharge driver 120 starts to decrease the signal level of the precharge control signal PC to the low level (time T5). In response to the precharge control signal PC in the low level, the precharge circuit 110 connects the power supply voltage Vcc and each pair of bit lines, and also equalizes the bit lines of each pair. Thus, the bit lines of each pair are precharged to the power supply voltage Vcc (1.0

V). At this time, due to the equalizing operation at the time T5, the voltage on the bit line /BL0 connected to the node in the high level data is temporarily reduced, but then precharged to the power supply voltage Vcc with time.

As described, in the conventional SRAM, before accessing the memory cell (selecting the word line), the pair of bit lines is precharged with the power supply voltage Vcc, and thereby the data reading and writing speeds can be improved.

On the other hand, as a memory characteristic of the conventional SRAM, an SNM (Static Noise Margin) is known. If the SNM is small, a write data is likely to be inverted due to noise received by a bit line. When the precharge voltage is equal to the power supply voltage as in the conventional SRAM illustrated in FIG. 1, the SNM is relatively small, and the write data is likely to be inverted.

In order to avoid such an inversion of data, a technique is known that sets the precharge voltage lower than the power supply voltage, and thereby increases the SNM to prevent data from being inverted due to noise. For example, Japanese Patent Publications (JP 2003-257182A: patent literature 1 and JP 2007-164888A: patent literature 2) describes SRAMs in which a precharge voltage is lower than the power supply voltage.

CITATION LIST

Patent literature 1: JP 2003-257182A
Patent literature 2: JP 2007-164888A

SUMMARY OF THE INVENTION

In the static random access memory described in Patent literature 1, the power supply voltage is pulled down by an ON resistance of an N-channel MOS transistor, and the pulled down voltage is then used as the precharge voltage. In this case, however, the precharge voltage is varied due to a variation in an ON resistance of the transistor. For this reason, a manufacturing variation of the transistors should be taken into account for the value of the SNM. Also, in recent years, an operation voltage of the static random access memory is reduced. In the static random access memory described in Patent literature 1, the power supply voltage of 3.3 V is assumed. However, in the static random access memory operating at the power supply voltage as low as approximately 1.0 V, a variation of the static random access memory due to a variation in the precharge voltage cannot be ignored.

The static random access memory described in Patent literature 2 is provided with a precharge circuit that controls supply of the precharge voltage lower than the power supply voltage to a pair of bit lines. However, a method for generating the precharge voltage is not disclosed, and therefore the above precharge voltage variation has not been solved. Also, in order to set the SNM to a desired value, the precharge voltage should be set in a high accuracy. For these reasons, the static random access memory is required that can precharge a bit line with an appropriate and stable precharge voltage.

In an aspect of the present invention, a static random access memory includes: a memory cell connected with a pair of bit lines and supplied with a power supply voltage from a first power supply; a precharge circuit connected with the pair of bit lines and configured to precharge the pair of bit lines with a precharge voltage; and a voltage reducing circuit connected between the precharge circuit and the first power supply. The voltage reducing circuit includes: a control circuit comprising a differential amplifier circuit which is configured to amplify a difference input of a reference voltage generated through resistance division of the power supply voltage and the precharge voltage supplied to a node to output a control signal; and a voltage reduction control transistor connected between the node and the first power supply and configured to generate the precharge voltage in response to the control signal. The precharge circuit includes: precharge transistors connected between the bit lines and the node and configured to control supply of the precharge voltage to the bit lines in response to a first precharge control signal.

In another aspect of the present invention, an accessing method of a static random access memory supplied with a power supply voltage from a first power supply, is achieved by generating a control signal by amplifying a difference input of a reference voltage generated through resistance division and a precharge voltage supplied to a node; by generating a precharge voltage from the power supply voltage from said first power supply by a voltage reduction control transistor in response to the control signal; and by precharging bit lines of a pair connected with a memory cell with the precharge voltage by controlling supply of the precharge voltage to the bit lines by precharge transistors in response to a first precharge control signal.

According to the present invention, an SNM in the static random access memory can be improved with high accuracy.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

Figure 1:
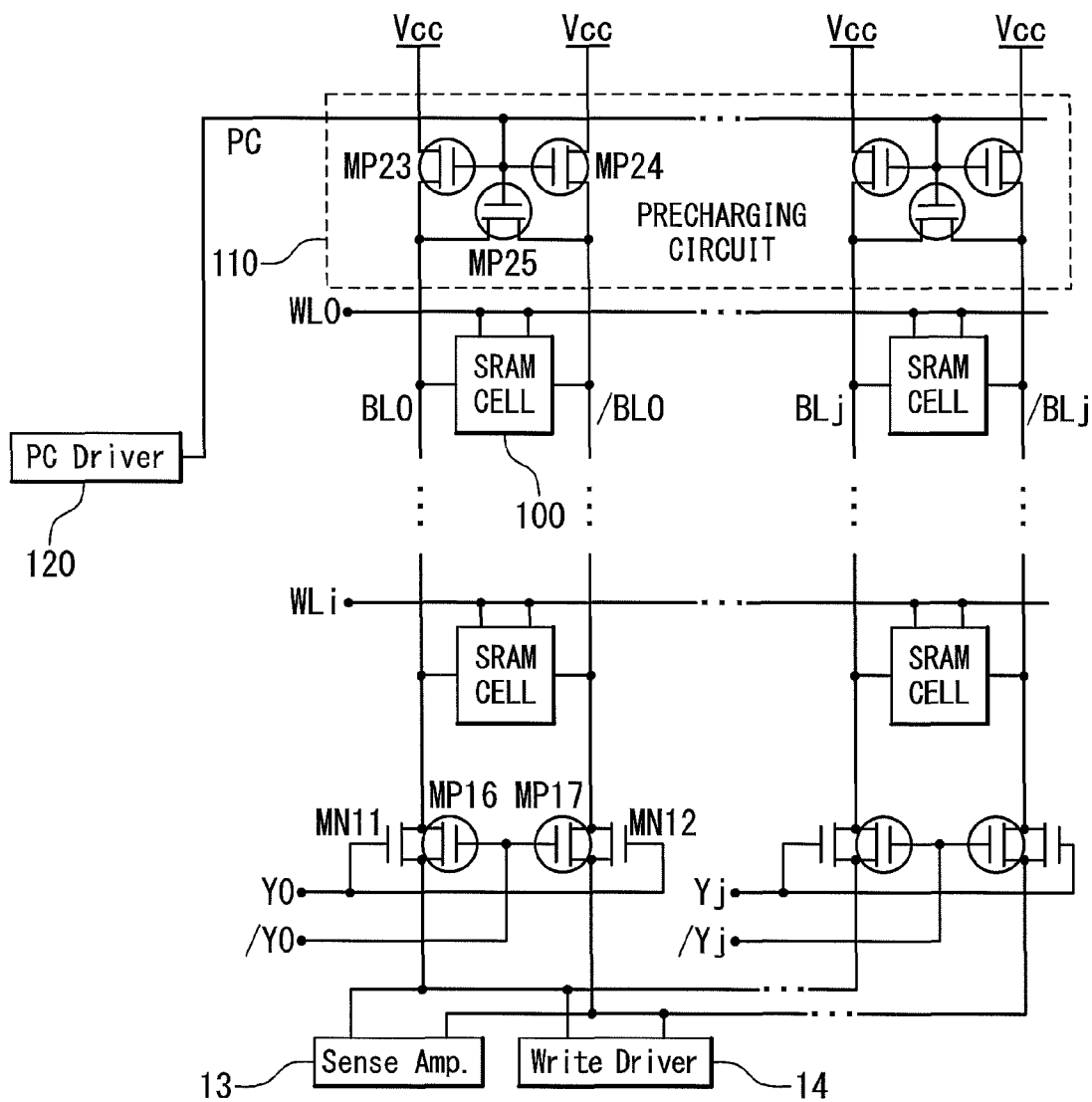
FIG. 1 is a diagram illustrating a configuration of a conventional static random access memory (SRAM)

Hereinafter, a static random access memory (SRAM) according to the present invention will be described with reference to the attached drawings. In the drawings, the same or similar reference symbols are assigned to the same or similar components.

First Embodiment

Referring to FIGS. 4 to 9, the SRAM according to a first embodiment of the present invention will be described.

Figure 4:
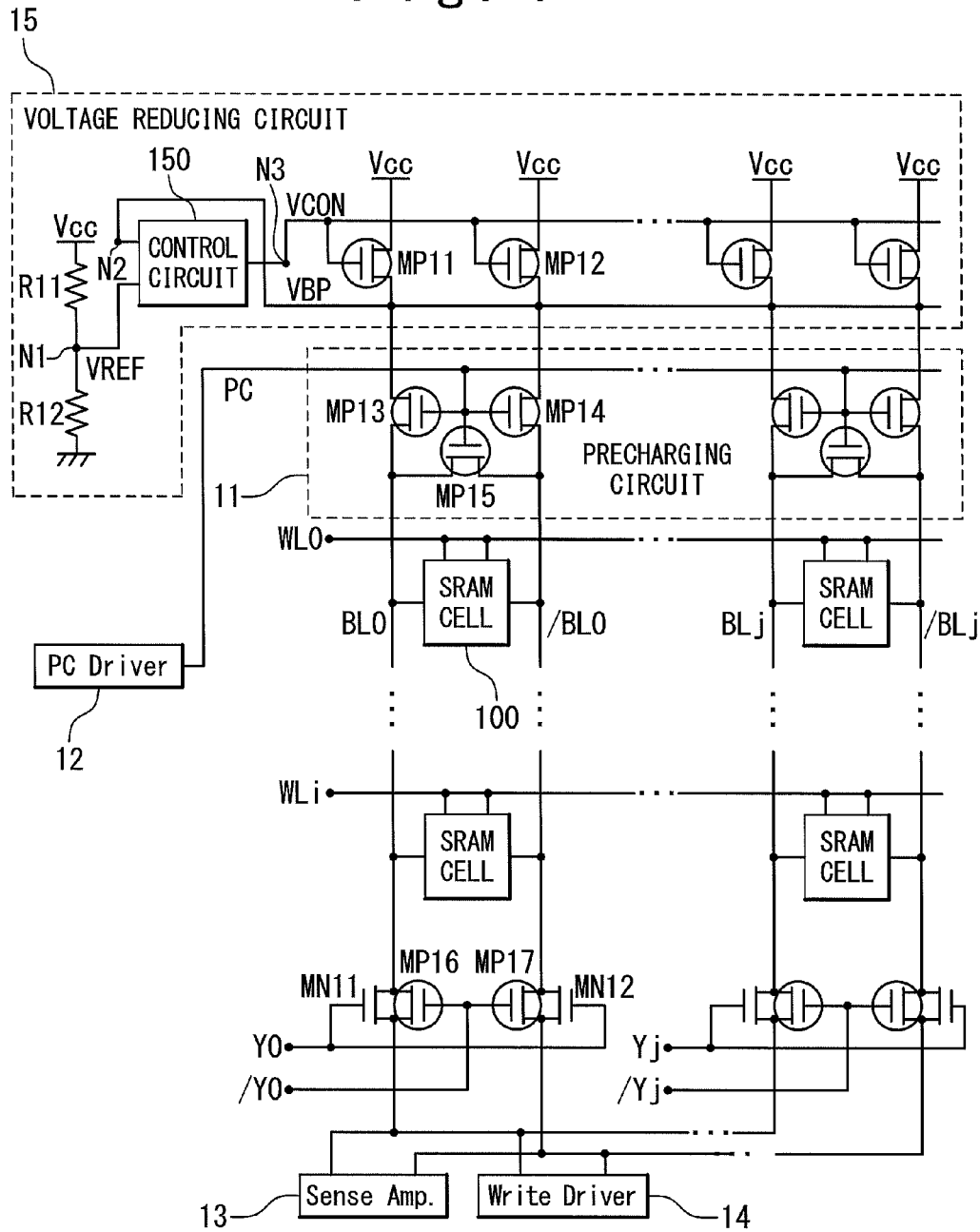
FIG. 4 is a block diagram illustrating a configuration of a static random access memory (SRAM) according to a first embodiment of the present invention.

FIG. 4 is a diagram illustrating a configuration of the SRAM according to the first embodiment of the present invention. The SRAM in the first embodiment includes a plurality of memory cells (SRAM cells) 100, a precharge circuit 11, a precharge driver 12, a sense amplifier 13, a write driver 14, and a voltage reducing circuit 15. The plurality of memory cells 100 are arranged in a matrix and are connected to a plurality of word lines WL0 to WLi and a plurality of pairs of bit lines BL0 and /BL0 to BLj and /BLj.

The precharge circuit 11, the precharge driver 12, the sense amplifier 13, the write driver 14, and the voltage reducing circuit 15 are connected to the plurality of pairs of bit lines BL0 and /BL0 to BLj and /BLj. In the following, the memory cell 100 connected to the word line WL0 and the pair of bit lines BL0 and /BL0 will be described. The other row and column configurations are same as that described below, and therefore the description is omitted.

The precharge circuit 11 according to the present invention is connected to a power supply voltage Vcc through the voltage reducing circuit. The precharge driver 12 in the first embodiment generates a precharge control signal PC in a high or low level to output it to the precharge circuit 11. In response to the precharge control signal PC in the low level, the precharge circuit 11 precharges the pair of bit lines BL0 and /BL0 with a precharge voltage lower than the power supply voltage Vcc. Specifically, the precharge circuit 11 is provided with precharge transistors MP13 and MP14 and an equalization transistor MP15 that are ON/OFF controlled in response to the precharge control signal PC supplied to gates of the respective transistors. The precharge transistors MP13 and MP14 are P-channel MOS transistors, of which sources and drains are respectively connected to the voltage reducing circuit 15 and the bit lines BL0 and /BL0, and gates are connected to the precharge control signal PC from the precharge driver 12. The precharge transistors MP13 and MP14 control a connection between the voltage reducing circuit 15 and the pair of bit lines BL0 and /BL0 in response to the precharge control signal PC. The equalizing transistor MP15 is a P-channel MOS transistor of which a source and a drain are connected between the bit lines BL0 and /BL0, and a gate is connected to the precharge control signal PC from the precharge driver 12. The equalizing transistor MP15 controls a connection between the bit lines BL0 and /BL0 in response to the precharge control signal PC.

The precharge circuit 11 precharges the plurality of pairs of bit lines BL0 and /BL0 to BLj and /BLj in response to the precharge control signal PC in the low level. At this time, the plurality of pairs of bit lines BL0 and /BL0 to BLj and /BLj are precharged with a voltage (a precharge voltage VBP in the first embodiment) supplied from the voltage reducing circuit 15.

Also, each of the plurality of pairs of bit lines BL0 and /BL0 to BLj and /BLj is connected to the sense amplifier 13 and the write driver 14 through a bit selecting section of bit line selection transistor sets MN11, MN12, MP16, and MP17 for each pair of bit lines. For example, the bit line selection transistors MN11 and MP16 function as a transfer gate that controls a connection between the bit line BL0 and the sense amplifier 13 and the write driver 14 in response to complementary selection signals Y0 and /Y0. Similarly, the bit line selection transistors MN12 and MP17 function as a transfer gate that controls a connection between the bit line /BL0 and the sense amplifier 13 and the write driver 14 in response to the complementary selection signals Y0 and /Y0. It should be noted that each of the plurality of pairs of bit lines BL0 and /BL0 to BLj and /BLj is connected to the sense amplifier 13 and the write driver 14 in response to a corresponding pair of selection signals Y0 and /Y0 to Yj and /Yj.

The word lines WL0 to WLi are activated (or supplied with a high voltage) from a word driver (not shown), and the access target memory cells 100 are selected. For example, one of the word lines WL0 to WLi is activated with the voltage equal to the power supply voltage Vcc, and is deactivated with a ground voltage (e.g., GND). The sense amplifier 13 detects voltages on the bit lines selected in response to the selection signals Y0 and /Y0, and a data having stored in the selected memory cell 100 is determined based on a difference between each of the detected voltages and a reference voltage. The write driver 14 supplies a voltage difference corresponding to a write data to the pair of bit lines BL0 and /BL0 selected in response to the selection signals Y0 and /Y0, and writes the write data in the selected memory cell 100.

The voltage reducing circuit 15 is provided with a pair of voltage reduction control transistors MP11 and MP12 for each pair of bit lines, a control circuit 150, and a resistance circuit having resistance elements R11 and R12. A source and a drain of each of the voltage reduction control transistors MP11 and MP12 are connected to the power supply voltage Vcc and a node N2, from which the precharge voltage VBP is outputted. A gate of each transistor is supplied with a control signal VCON outputted from the control circuit 150. The voltage reduction control transistors MP11 and MP12 are preferably P-channel MOS transistors. In this case, the drains of the voltage reduction control transistors MP11 and MP12 are connected to the precharge transistors MP13 and MP14 through the node N2. The voltage reduction control transistors MP11 and MP12 may be respectively provided for the precharge transistors MP13 and MP14 which are provided for each pair of the bit lines, as illustrated in FIG. 4.

The resistance elements R11 and R12 in the resistance circuit are connected in series between the power supply voltage Vcc and a ground voltage GND in this case. The resistance circuit performs a resistance division of a voltage difference between the power supply voltage Vcc and the ground voltage, and outputs as a reference voltage VREF from a node N1 that is a connecting point between the resistance elements R11 and R12. In this case, the reference voltage VREF is generated based on a ratio of the resistance elements R11 and R12. Each of the resistance elements R11 and R12 is preferably formed by use of any of a impurity well, a diffusion layer, a polysilicon layer, and the like, or a combination of them. Alternatively, each of the resistance elements R11 and R12 may be formed by use of an ON resistor of an MOS transistor. The reference voltage VREF is generated through the resistance division of the voltage Vcc based on the ratio of the resistance elements R11 and R12, and therefore hardly changes depending on variations in process and temperature.

The control circuit 150 is connected to the resistance circuit (node N1) and voltage reduction control transistors MP11 and MP12 (nodes N2 and N3), and receives the reference voltage VREF and the precharge voltage VBP to output the control signal VCON to the gates of the voltage reduction control transistors.

Figure 5:
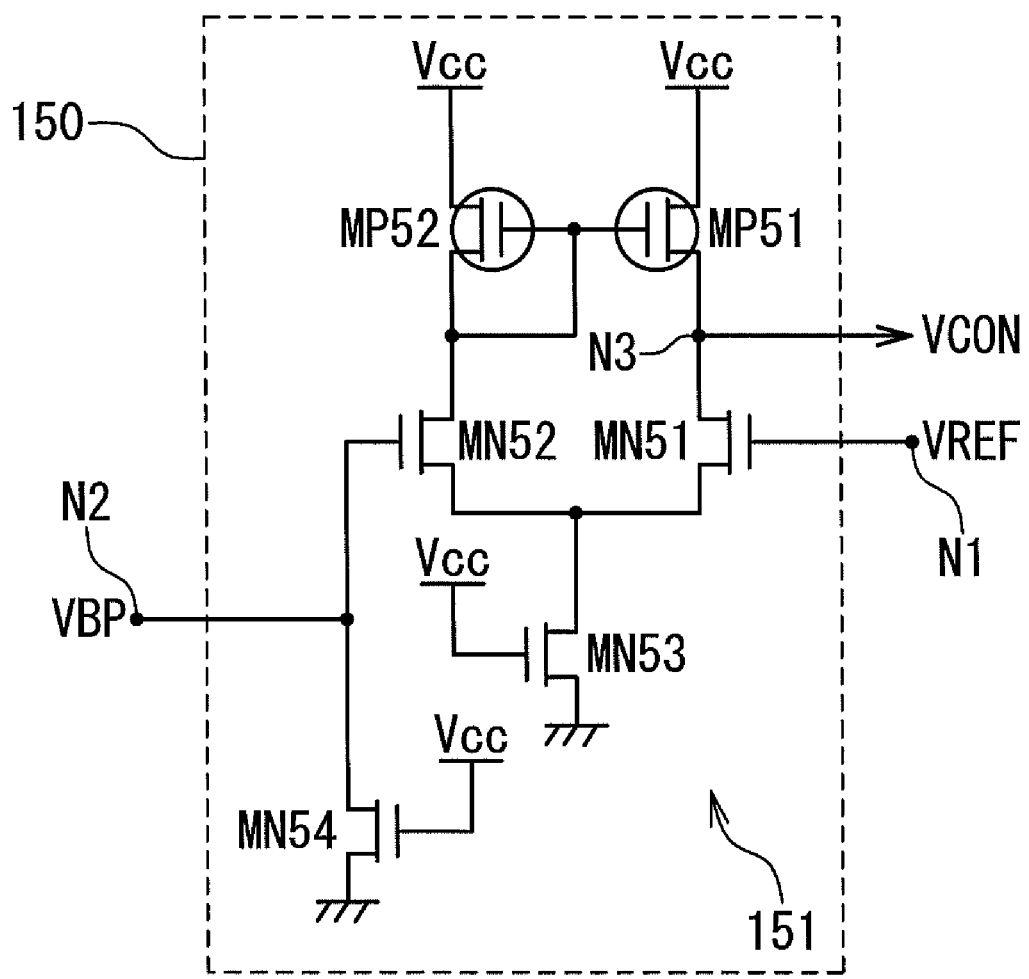
FIG. 5 is a circuit diagram illustrating a configuration of a control circuit according to the first embodiment of the present invention.

FIG. 5 is a circuit diagram illustrating a configuration of the control circuit 150 according to the first embodiment of the present invention. Referring to FIG. 5, details of the configuration of the control circuit 150 in the first embodiment will be described. The control circuit 150 is connected between the power supply voltage Vcc and the ground voltage GND. The control circuit 150 includes a differential amplifier circuit 151 that is connected between the power supply voltage Vcc and the ground voltage GND, and the precharge voltage VBP and the reference voltage VREF are supplied and the control signal VCON is outputted. An N-channel MOS transistor MN54 that is connected between the node N2 and the ground voltage GND and has a gate supplied with the power supply voltage Vcc (high level). The differential amplifier circuit 151 includes an N-channel MOS transistor MN53, of which a source is connected to a ground voltage GND to form a current source; P-channel MOS transistor MP51 and MP52 of which sources are connected in common to the power supply voltage Vcc to form active loads; and N-channel MOS transistors MN51 and MN52 of which sources are connected in common to the current source (drain of the N-channel MOS transistor MN53) to form a differential amplifier.

A gate of the N-channel MOS transistor MN51 is connected to the node N1, and receives the reference voltage VREF through the node N1. A gate of the N-channel MOS transistor MN52 is connected to the node N2, and receives the precharge voltage VBP through the node N2. The node N2 is connected with a drain of the N-channel MOS transistor MN54 of which a source is grounded. The N-channel MOS transistor MN54 is provided in order for the node N2 to keep the precharge voltage VBP even when the precharge transistors MP13, MP14, and MP15 are in an off state. Accordingly, the N-channel MOS transistor MN54 is required to have only small current drivability, and therefore an occupied area thereof can be made small.

Gates of the P-channel MOS transistors MP51 and MP52, and drains of the P-channel MOS transistor MP52 and the N-channel MOS transistor MN52 are connected in common. Drains of the P-channel MOS transistor MP51 and the N-channel MOS transistor MN51 are connected to the node N3, which serves as an output terminal for the control signal VCON.

In this way, the voltage reducing circuit 15 generates the precharge voltage VBP equal to the reference voltage VREF generated by the resistance division to supply it to the precharge circuit 11. The reference voltage VREF can be obtained by resistance division of the power supply voltage Vcc. For this reason, by setting the resistance elements R11 and R12 to appropriate values, the desired precharge voltage VBP lower than the power supply voltage Vcc can be easily obtained. Also, the reference voltage VREF is hardly changed by the variations in process and temperature as described above. For this reason, the precharge voltage VBP is also hardly changed by the variations in process and temperature.

Figure 6:
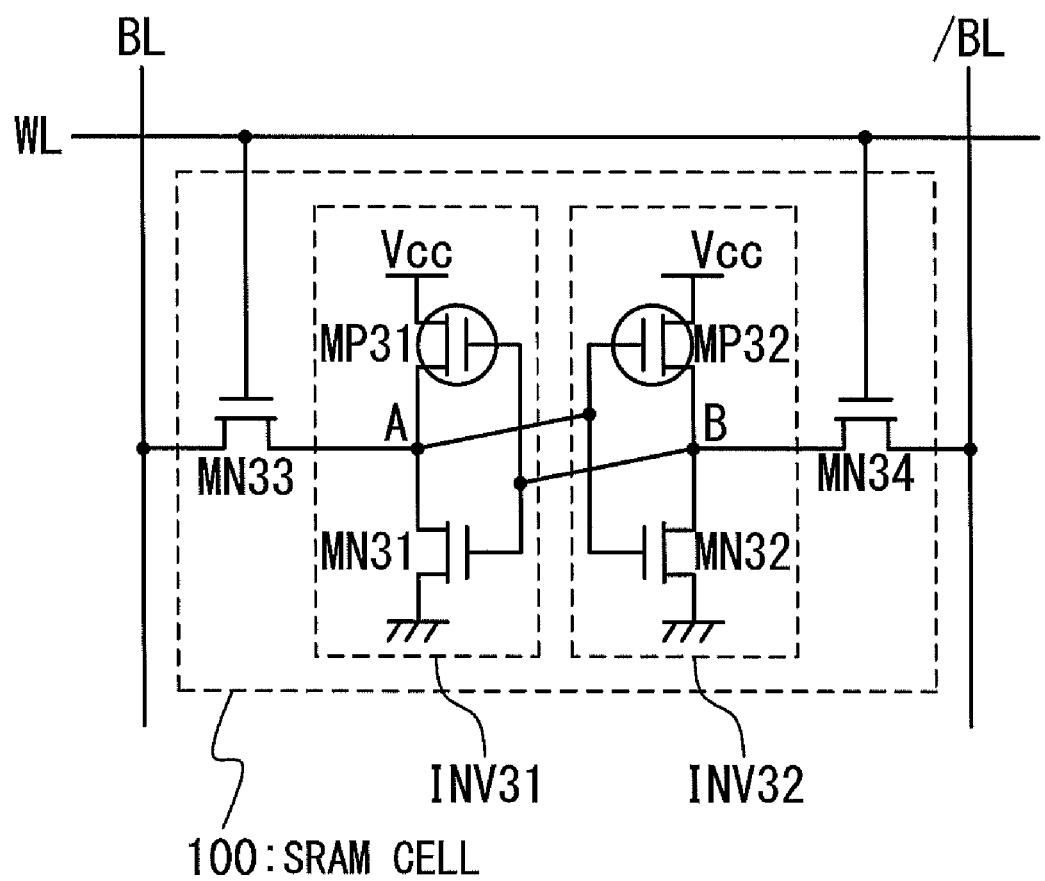
FIG. 6 is a circuit diagram illustrating a configuration of a memory cell according to the present invention.

FIG. 6 is a diagram illustrating an example of a configuration of the memory cell 100 (SRAM cell) according to the present invention. Referring to FIG. 6, the memory cell 100 is provided with: a positive feedback loop (flip-flop) including two CMOS inverters INV31 and INV32; and two N-channel MOS transistors MN33 and MN34 (hereinafter, to be referred to as access transistors MN33 and MN34) that control respective connections between the bit lines BL0 and /BL0 and the inverters INV31 and INV32. In addition, the inverter INV31 is provided with a P-channel MOS transistor MP31 and an N-channel MOS transistor MN31 connected between the power supply voltage Vcc and the ground voltage GND, and connected to the access transistor MN33 through a node A. Also, the inverter INV32 is provided with a P-channel MOS transistor MP32 and an N-channel MOS transistor MN32 connected between the power supply voltage Vcc and the ground voltage GND, and connected to the access transistor MN34 through a node B.

In the SRAM according to the present invention, on the basis of the configuration described above, the precharge circuit 11 can precharge the pair of bit lines BL0 and /BL0 to BLj and /BLj with the precharge voltage lower than the power supply voltage Vcc.

Next, referring to FIGS. 7 and 8, an operation of accessing the memory cell in the SRAM according to the present invention will be described.

Figure 7:
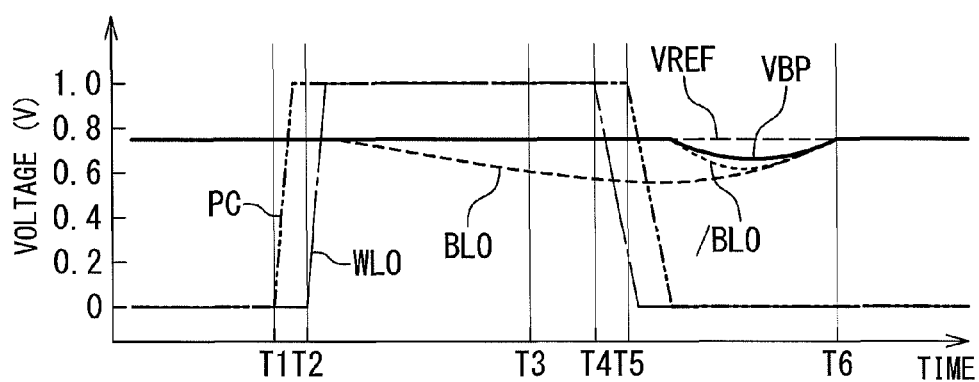
FIG. 7 is a timing chart illustrating a data read operation of the SRAM according to the first embodiment of the present invention.

FIG. 7 shows timing charts in a data read operation in the SRAM according to the first embodiment of the present invention. Referring to FIG. 7, the data read operation on the memory cell 100 connected to the pair of bit lines BL0 and /BL0 and word line WL0 ill be described. The precharge voltage VBP is applied by supplying to the voltage reduction control transistor MP11 or MP12, the output voltage (control signal VCON) determined based on the differential inputs of the reference voltage VREF set on the basis of the ratio of resistances and the precharge voltage. It is assumed that, as an example, the precharge voltage VBP of 0.75 V lower than the power supply voltage Vcc of 1.0 V is supplied to the node N2.

Before the word line WL0 is activated, the precharge driver 12 outputs the precharge control signal PC in the low level (ground voltage GND) to the precharge circuit 11. In response to the precharge control signal PC in the low level, the precharge circuit 11 supplies the precharge voltage VPB (0.75 V) to the pair of bit lines BL0 and /BL0, and also equalizes the pair of bit lines BL0 and /BL0. That is, before the activation of the word line WL0, the pair of bit lines BL0 and /BL0 is precharged with the precharge voltage VBP lower than the power supply voltage Vcc.

When the word line WL0 is selected, the precharge driver 12 starts to increase the signal level of the precharge control signal PC prior to the activation of the word line WL0 (time T1). In response to the precharge control signal PC in the high level (power supply voltage Vcc), the precharge circuit 11 set the pair of bit lines BL0 and /BL0 to a floating state to disconnect the pair of bit lines BL0 and /BL0 from the node N2 (precharge voltage VBP). Then, the word line WL0 is activated to the high level (power supply voltage Vcc) by a word driver (not shown) (time T2). While the word line WL0 is in the activation state, voltages on the pair of bit lines BL0 and /BL0 are detected by the sense amplifier 13 (time T3).

Figure 2:
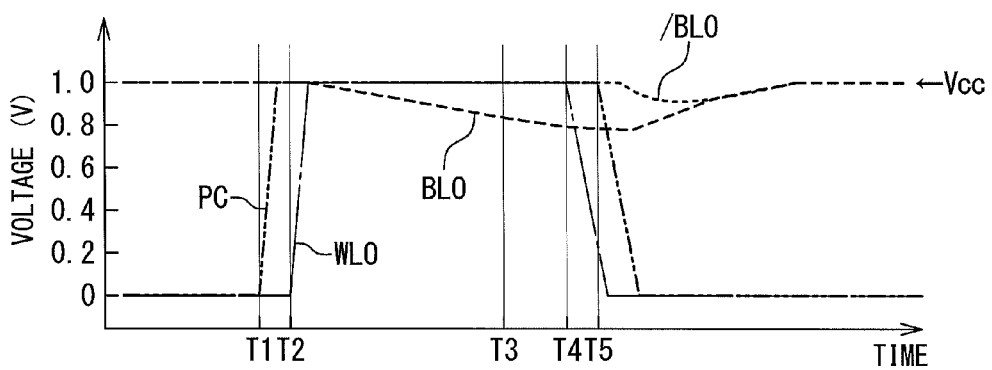
FIG. 2 shows timing charts in a data read operation to the conventional SRAM.
Figure 3:
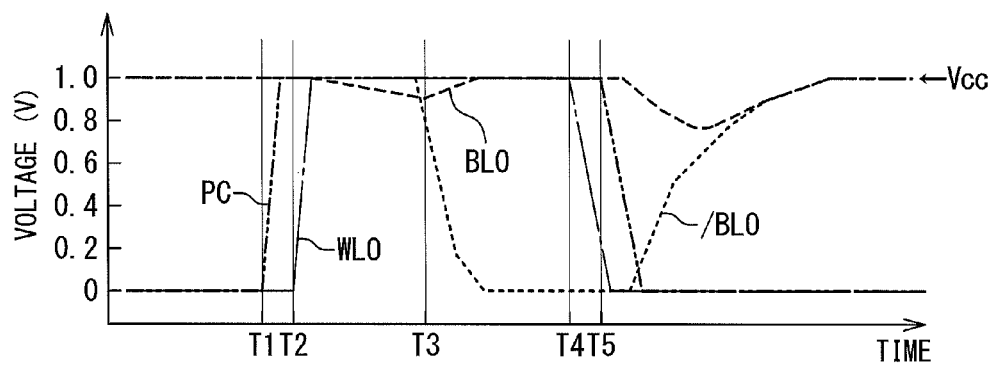
FIG. 3 shows timing charts in a data write operation to the conventional SRAM.

It is assumed that the bit line BL0 is connected to the node A in the low level in the memory cell 100, and the bit line /BL0 is connected to the node B in the high level. In this case, when the word line WL0 is activated, the voltage of the bit line BL0 is reduced, and a difference between the voltage of the bit line BL0 and the power supply voltage Vcc is sensed by the sense amplifier 13. Thus, a data having stored in the memory cell 100 can be determined. In the above manner, the data having stored in the memory cell 100 connected to the word line WL0 and the pair of bit lines BL0 and /BL0 is read. In the present invention, the bit line BL0 before the activation of the word line WL0 is precharged to a voltage lower than the power supply voltage Vcc, and therefore the voltage of the bit line BL0 at the time T3 has a low value as compared with the case where the bit line BL0 is precharged with the power supply voltage Vcc. For this reason, the difference detected by the sense amplifier 13 is large as compared with the conventional example illustrated in FIG. 2, and therefore a read error is unlikely to occur.

After the data has been read, the word line WL0 is deactivated to the low level (ground voltage GND) (time T4), and then the precharge driver 12 starts to decrease the signal level of the precharge control signal PC to the low level (time T5). At this time, currents flowing through the voltage reduction control transistors MP11 and MP12 are rapidly increased, and therefore the precharge voltage VBP is reduced for a moment, but then recovered to the reference voltage VREF by the control circuit 150. In response to the precharge control signal PC in the low level (ground voltage GND), the precharge circuit 11 connects the node N2 and the pair of bit lines BL0 and /BL0, and also equalizes the bit lines BL0 and /BL0. Thus, the pair of bit lines BL0 and /BL0 can be again precharged to the precharge voltage VBP (0.75 V). At this time, due to the equalizing operation at time T5, the voltage on the bit line /BL0 connected to the node in the high level data is temporarily reduced, but then precharged to the precharge voltage VBP with time.

Figure 8:
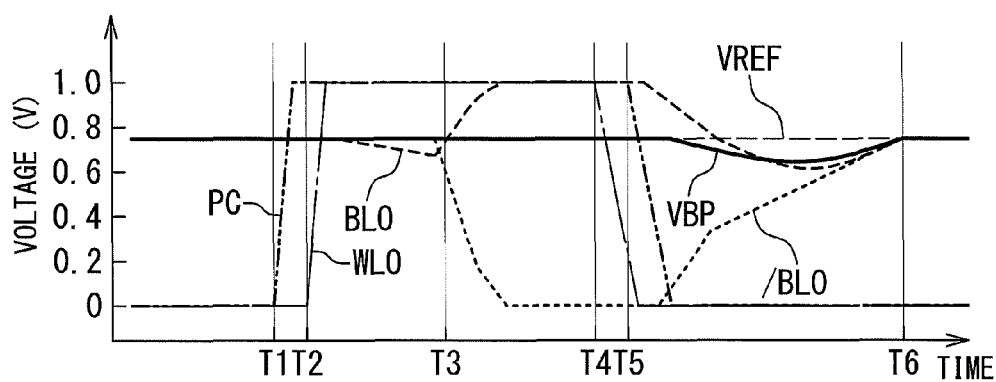
FIG. 8 shows timing charts in a data write operation of the SRAM according to the first embodiment of the present invention.

FIG. 8 shows timing charts in a data write operation in the SRAM according to the first embodiment of the present invention. Referring to FIG. 8, the data write operation on the memory cell 100 connected to the pair of bit lines BL0 and /BL0 and word line WL0 will be described. The precharge voltage VBP is applied by supplying to the voltage reduction control transistor MP11 or MP12, the output voltage (control signal VCON) determined based on the differential input between the reference voltage VREF set based on the ratio of resistances and the precharge voltage. It is assumed that, as an example, the precharge voltage VBP of 0.75 V lower than the power supply voltage Vcc of 1.0 V is supplied to the node N2.

Before the word line WL0 is activated, the precharge driver 12 outputs the precharge control signal PC in the low level to the precharge circuit 11. In response to the precharge control signal PC in the low level, the precharge circuit 11 connects the node N2 and the pair of bit lines BL0 and /BL0, and also equalizes the bit lines BL0 and /BL0. Thus, before the activation of the word line WL0, the pair of bit lines BL0 and /BL0 is precharged with the precharge voltage VBP lower than the power supply voltage Vcc.

When the word line WL0 is selected, the precharge driver 12 starts to increase the signal level of the precharge control signal PC prior to the activation of the word line WL0 (time T1). In response to the precharge control signal PC in the high level, the precharge circuit 11 sets the pair of bit lines BL0 and /BL0 to the floating state to disconnect the node N2 (precharge voltage VBP) from the pair of bit lines BL0 and /BL0. Then, the word line WL0 is activated by the word driver (not shown) (time T2), and a data is written by the write driver 14 (time T3). It is assumed that a high level data is written to the node connected to the bit line BL0 in the memory cell 100, and a low level data is written to the node connected to the bit line /BL0. In this case, the bit line BL0 becomes the high level (power supply voltage Vcc of 1.0 V), and the bit line /BL0 becomes the low level (ground voltage GND of 0 V).

After the data has been written, the word line WL0 is deactivated (time T4), and then the precharge driver 12 starts to decrease the signal level of the precharge control signal PC to low level (time T5). In response to the precharge control signal PC in the low level, the precharge circuit 11 connects the node N2 and the pair of bit lines BL0 and /BL0, and also equalizes the bit lines BL0 and /BL0. Thus, the pair of bit lines BL0 and /BL0 is again precharged to the precharge voltage VBP (0.75 V). At this time, due to the equalizing operation at the time T5, the voltage of the bit line BL0 connected to the node on the side of the high level data is temporarily reduced, but then precharged to the precharge voltage VBP with time.

Figure 9:
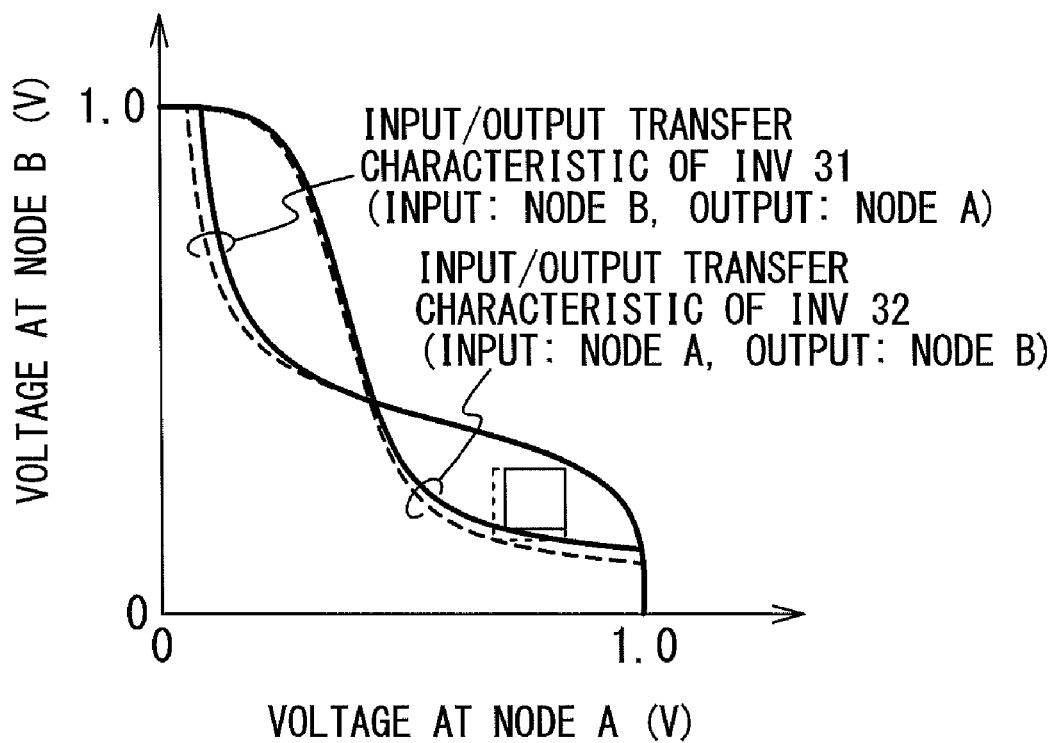
FIG. 9 is an SNM characteristic diagram illustrating an SNM improvement effect according to the present invention.

FIG. 9 is an SNM characteristic diagram illustrating an SNM improvement effect according to the present invention. FIG. 9 illustrates SNM characteristics (solid line) for the case where, in the conventional SRAM, a bit line is precharged with the power supply voltage Vcc (1.0 V), and SNM characteristics (dashed line) for the case where, in the present invention, a bit line is precharged with the precharge voltage VBP (0.75 V). In the diagram, input/output characteristics of the inverter INV31 (input: node B, output: node A), and input/output characteristics in the INV32 (input: node A, output: node B) are respectively illustrated for the both cases.

As illustrated in FIG. 9, rather than the case of the precharging with the power supply voltage Vcc, the precharging with the precharge voltage VBP results in a small SNM. Thus, the held data is unlikely to be inverted, and consequently an SRAM is unlikely to be influenced by noise. To effectively improve the SNM, it is necessary to supply an optimum voltage to the pair of bit lines BL0 and /BL0. Accordingly, in the present invention, this can be easily achieved by adjusting the ratio of the two resistance elements R11 and R12.

As described above, when the precharge voltage VBP is lower than the power supply voltage Vcc, the SNM is decreased (improved). However, if the precharge voltage VBP is too low, the access transistor MN34 connected to the node B on the side of the high level data is set to an ON state to reduce the voltage (high level) held on the side of the node B. Therefore, the SNM may be degraded (increased). For this reason, a difference between the precharge voltage VBP and the power supply voltage Vcc is preferably set to be smaller than threshold voltages of the access transistors MN33 and MN34.

Second Embodiment

Referring to FIGS. 10 to 13, the SRAM according to a second embodiment of the present invention will be described.

Figure 10:
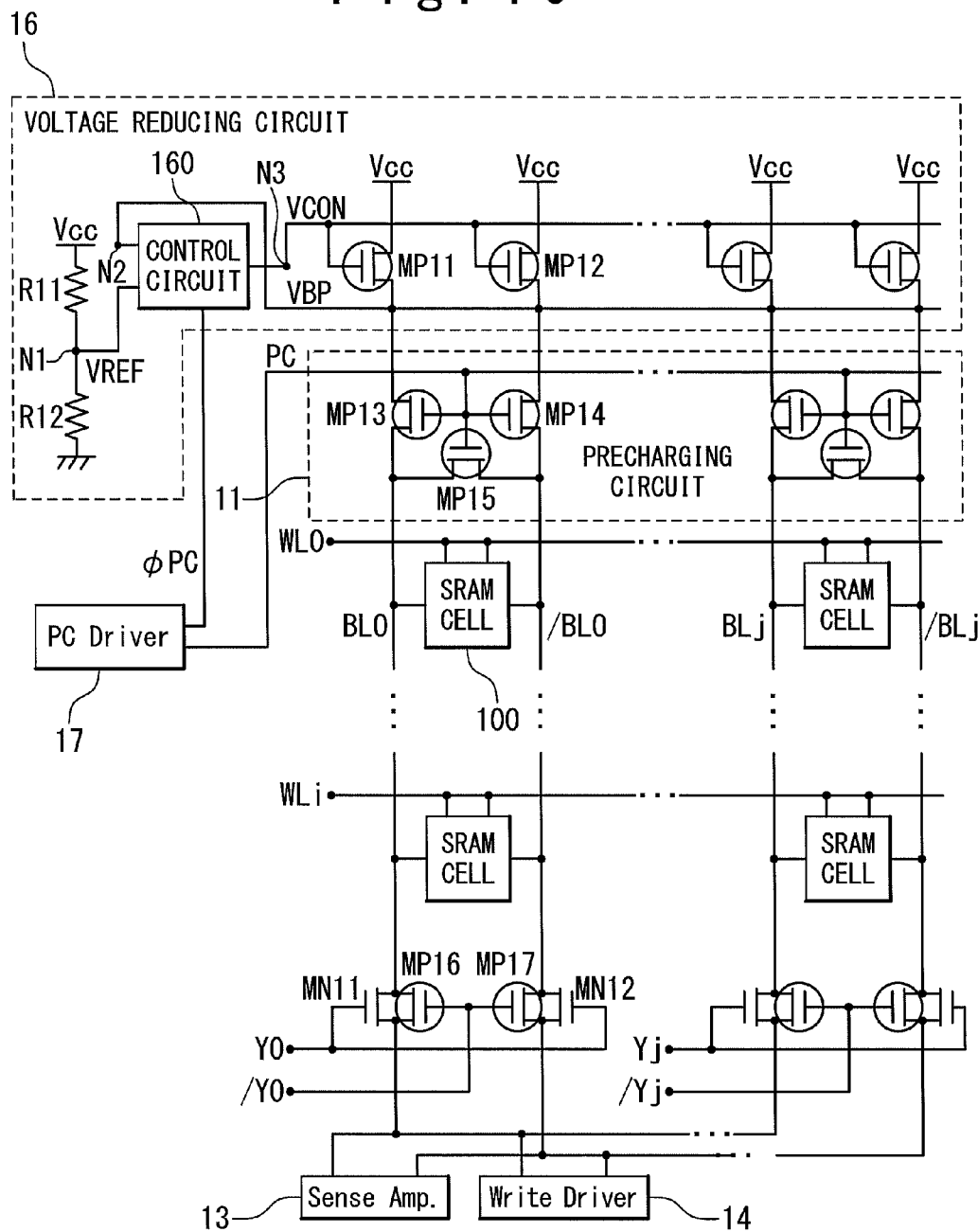
FIG. 10 is a block diagram illustrating a configuration of the SRAM according to a second embodiment of the present invention.

FIG. 10 is a diagram illustrating a configuration of the SRAM according to the second embodiment of the present invention. The second embodiment is different from the first embodiment in the configurations and operations of the voltage reducing circuit and the precharge driver. The other configurations and operations are the same. In the following, details of the SRAM in the second embodiment will be described in terms of the differences from the first embodiment.

The SRAM in the second embodiment is provided with a precharge driver 17 that outputs a first precharge control signal PC and a second precharge control signal φPC; and a voltage reducing circuit 16 that changes the precharge voltage VBP in response to the second precharge control signal φPC.

Figure 11:
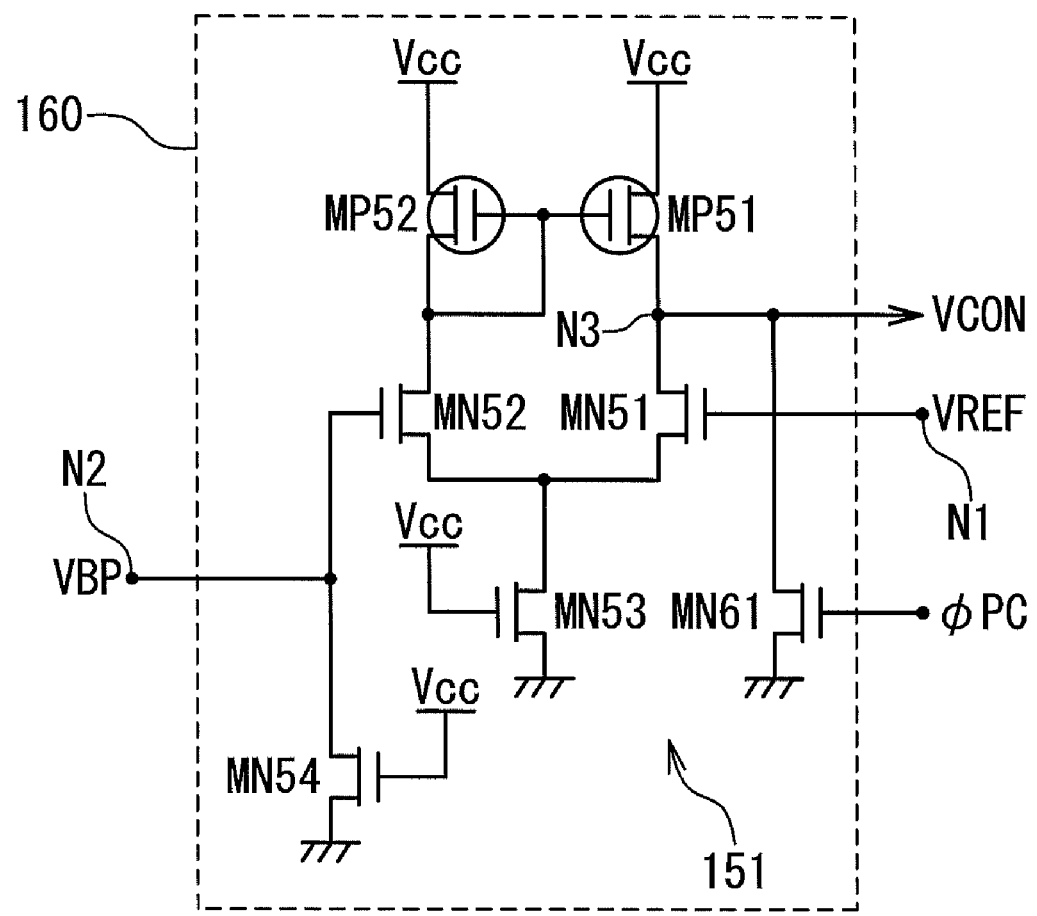
FIG. 11 is a circuit diagram illustrating a configuration of the control circuit according to the second embodiment of the present invention.

The voltage reducing circuit 16 is provided with a control circuit 160 illustrated in FIG. 11 in place of the control circuit 150 in the first embodiment. The remaining components are the same as those in the first embodiment. Referring to FIG. 11, the control circuit 160 further includes an N-channel MOS transistor MN61 which is connected between the node N3 and the ground voltage GND, compared with the configuration of the control circuit 150. The N-channel MOS transistor MN61 controls a connection between the node N3 and the ground voltage GND in response to the precharge control signal φPC which is supplied to a gate of the transistor MN61.

The precharge driver 17 outputs the second precharge control signal φPC (pulse signal) having a high level for a predetermined period PW. In response to the precharge control signal φPC in the high level, the N-channel MOS transistor MN61 pulls down a voltage of the node N3 to the ground voltage GND. Thus, a voltage of the control signal VCON is reduced toward the ground voltage GND, and a voltage of the precharge voltage VBP at a node N2 is raised toward the power supply voltage Vcc.

Next, referring to FIGS. 12 and 13, the operation of accessing the memory cell 100 in the SRAM according to the present invention will be described.

Figure 12:
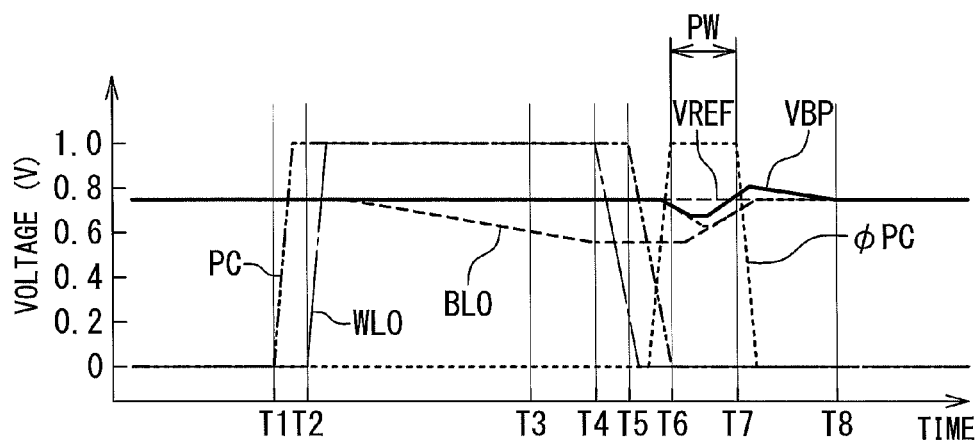
FIG. 12 shows timing charts in the data read operation of the SRAM according to the second embodiment of the present invention.

FIG. 12 shows timing charts in the data read operation in the SRAM according to the second embodiment of the present invention. Referring to FIG. 12, the operation from time T1 to time T4 is the same as that in the first embodiment, and therefore description thereof is omitted.

After the word line has been deactivated, the precharge driver 17 starts to decrease a signal level of the first precharge control signal PC to the low level (time T5). At this time, currents flowing through the voltage reduction control transistors MP11 and MP12 are rapidly increased, and therefore the precharge voltage VBP is reduced for a moment. In the present embodiment, at timing when the first precharge control signal PC reaches the low level (the ground voltage GND), a signal level of the second precharge control signal φPC starts to be increased (time T5). The second precharge control signal φPC keeps the high level (power supply voltage Vcc) from time T6 to time T7 (for the predetermined period PW), and is then pulled down to the low level. Thus, the control signal VCON is pulled down toward the low level for the period PW, and the precharge voltage VBP is pulled up toward the power supply voltage Vcc by the voltage reduction control transistors MP11 and MP12. As a result, the precharge voltage VBP which has been reduced at the start time of precharging can be quickly recovered to the reference voltage VREF.

In response to the precharge control signal PC in the low level, the precharge circuit 11 connects the node N2 and the pair of bit lines BL0 and /BL0, and also equalizes the bit lines BL0 and /BL0. Thus, the pair of bit lines BL0 and /BL0 is again precharged to the precharge voltage VBP (0.75 V). At this time, due to the equalizing operation at the time T5, a voltage of the bit line /BL0 connected to the node on the side of the high level data is temporarily reduced, but then precharged to the precharge voltage VBP with time.

Figure 13:
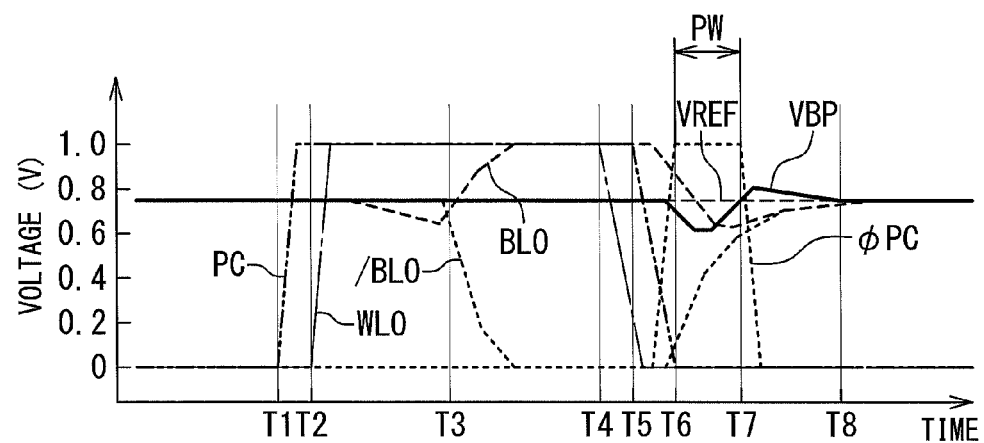
FIG. 13 shows timing charts in the data write operation of the SRAM according to the second embodiment of the present invention.

FIG. 13 shows timing charts in the data write operation of the SRAM according to the second embodiment of the present invention. Referring to FIG. 13, the operation from time T1 to time T4 is the same as that in the first embodiment, and therefore description thereof is omitted.

Before the word line WL0 is activated, the precharge driver 12 outputs the first precharge control signal PC in the low level to the precharge circuit 11. In response to the precharge control signal PC in the low level, the precharge circuit 11 connects the node N2 and the pair of bit lines BL0 and /BL0, and also equalizes the bit lines BL0 and /BL0. Thus, before the activation of the word line WL0, the pair of bit lines BL0 and /BL0 is precharged with the precharge voltage VBP lower than the power supply voltage Vcc.

After the word line has been deactivated, the precharge driver 17 starts to increase the signal level of the first precharge control signal PC (time T5). At this time, the currents flowing through the voltage reduction control transistors MP11 and MP12 are rapidly increased, and therefore the precharge voltage VBP is reduced for a moment. In the present embodiment, at the timing when the first precharge control signal PC reaches the low level (the ground voltage GND), the signal level of the second precharge control signal φPC starts to be increased (time T5). The second precharge control signal φPC keeps the high level from time T6 to time T7 (for the predetermined period PW), and is then pulled down to the low level. Thus, the control signal VCON is pulled down toward the low level for the period PW, and the precharge voltage VBP is pulled up toward the power supply voltage Vcc by the voltage reduction control transistors MP11 and MP12. As a result, the precharge voltage VBP which has been reduced at the start time of precharging can be quickly recovered to the reference voltage VREF.

In response to the precharge control signal PC in the low level, the precharge circuit 11 connects the node N2 and the pair of bit lines BL0 and /BL0, and also equalizes the bit lines BL0 and /BL0. Thus, the pair of bit lines BL0 and /BL0 is again precharged to the precharge voltage VBP (0.75 V). At this time, due to the equalizing operation at the time T5, the voltage of the bit line /BL0 connected to the node on the side of the high level data is temporarily reduced, but then precharged to the precharge voltage VBP with time.

In the write operation, one of the bit lines BL0 and /BL0 (in this case, the bit line /BL0) transits to the ground voltage GND. In this case, a time necessary for the recovery to the precharge voltage VBP, and a time necessary to complete the precharging of the pair of bit lines BL0 and /BL0 are increased as compared with the read operation. However, in the SRAM according to the present embodiment, the precharge voltage VBP is pulled up toward the power supply voltage Vcc for the predetermined period PW by the control circuit 160, and therefore such times can be significantly shortened.

As described above, according to the SRAM of the present embodiment, an optimum bit line voltage can be achieved without the degradation in read or write time.

In the SRAM according to the present invention, the precharging is performed by a P-channel MOS transistor, and therefore the operation of pulling up a bit line immediately before access to a memory cell is not required. For this reason, a time necessary for the operation of accessing the memory cell can be shortened. Also, an output voltage (precharge voltage VBP) of a voltage reducing circuit can be set by adjusting values of resistance elements separately from the voltage reduction control transistors MP11 and MP12.

Figure 14:
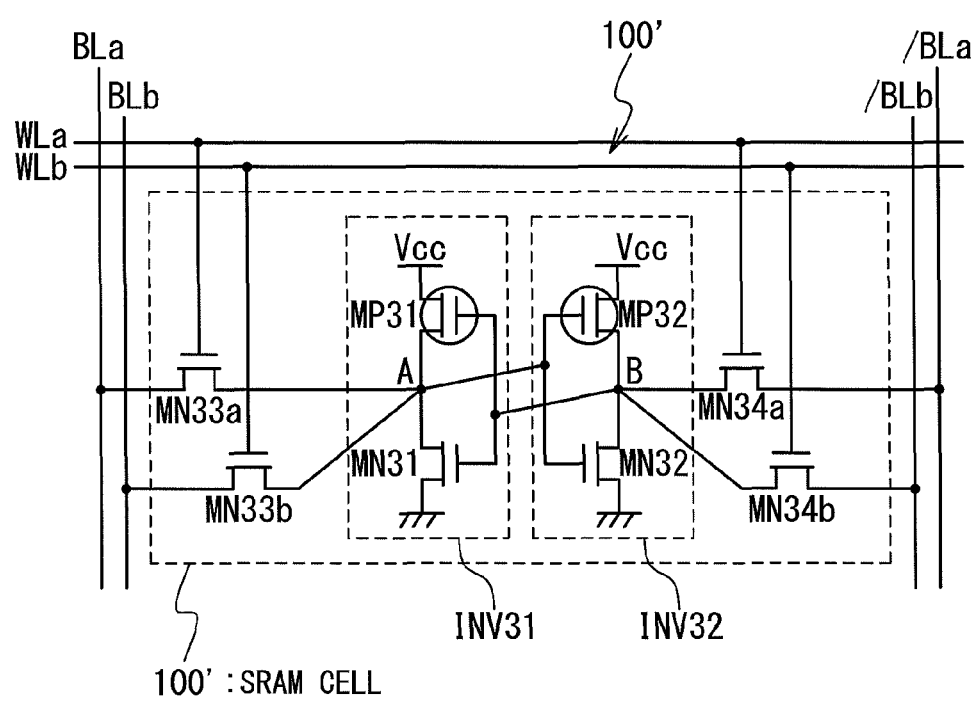
FIG. 14 shows diagram illustrating another example of the configuration of the memory cell according to the present invention.

In the above, the embodiments of the present invention have been described in details. However, a specific configuration is not limited to any of the above-described embodiments, but any modification without departing from the scope of the present invention is included in the present invention. For example, the present invention may be applied to a dual access SRAM. In this case, in place of the memory cell 100, a memory cell 100' illustrated in FIG. 14 is used. The memory cell 100' is provided with access transistors MN33a and MN34a connected to a first word line WL1 and a pair of bit lines BLa and /BLa; and access transistors MN33b and MN34b connected to a second word line WLb and a pair of bit lines BLb and /BLb, and the remaining components of the memory cell 100' is the same as that of the memory cell 100.

What is claimed is:
1. A static random access memory comprising:
a memory cell connected with a pair of bit lines and supplied with a power supply voltage from a first power supply;
a precharge circuit connected with said pair of bit lines and configured to precharge said pair of bit lines with a precharge voltage; and a voltage reducing circuit connected between said precharge circuit and said first power supply,
wherein said voltage reducing circuit comprises:
a control circuit comprising a differential amplifier circuit which is configured to amplify a difference input of a reference voltage generated through resistance division of said power supply voltage and said precharge voltage supplied to a node to output a control signal; and
a voltage reduction control transistor connected between said node and said first power supply and configured to generate said precharge voltage in response to said control signal, and
wherein said precharge circuit comprises:
precharge transistors connected between said bit lines and said node and configured to control supply of the precharge voltage to said bit lines in response to a first precharge control signal.

2. The static random access memory according to claim 1, wherein said memory cell comprises access transistors which are respectively connected with said bit lines, and
a difference between said precharge voltage and said power supply voltage is smaller than threshold voltages of said access transistors.

3. The static random access memory according to claim 1, wherein said power supply voltage is equal to a voltage in activation of a word line connected with said memory cell.

4. The static random access memory according to claim 1, wherein said control circuit further comprises:
a precharge control transistor configured to change a signal level of said control signal, and
wherein said voltage reduction control transistor connects said first power supply and said node based on the changed signal level of said control signal.

5. The static random access memory according to claim 4, wherein said precharge control transistor is connected between an output terminal from which said control signal is outputted and a second power supply and is configured to connect the output terminal and said second power supply in response to a second precharge control signal.

6. The static random access memory according to claim 5, further comprising:
a precharge driver configured to generate said first precharge control signal and said second precharge control signal,
wherein said precharge driver changes a signal level of said second precharge control signal in response to a change of a signal level of said first precharge control signal.

7. The static random access memory according to claim 1, wherein said memory cell comprises:
two inverters configured to form a flip-flop, and
two access transistors respectively connected between said two inverters and said bit lines.

8. The static random access memory according to claim 1, wherein said memory cell comprises:
two inverters configured to form a flip-flop;
two first access transistors respectively connected between said two inverters and said bit lines; and
two second access transistors respectively connected between said two inverters and second bit lines of a pair.

9. The static random access memory according to claim 1, wherein said voltage reduction control transistor is a P-channel MOS transistor.

10. The static random access memory according to claim 1, wherein said voltage reducing circuit further comprises a resistance circuit configured to generate said reference voltage, and
wherein said resistance circuit is formed of any of polysilicon films, diffusion layers or wells.

11. The static random access memory according to claim 1, wherein said voltage reducing circuit further comprises a resistance circuit configured to generate said reference voltage, and
said resistance circuit is formed from a plurality of transistors having ON resistances.

12. An accessing method of a static random access memory supplied with a power supply voltage from a first power supply, comprising:
generating a control signal by amplifying a difference input of a reference voltage generated through resistance division and a precharge voltage supplied to a node;
generating a precharge voltage from the power supply voltage from said first power supply by a voltage reduction control transistor in response to said control signal;
precharging a pair of bit lines connected with a memory cell with the precharge voltage by controlling supply of the precharge voltage to said bit lines by precharge transistors in response to a first precharge control signal.

13. The accessing method according to claim 12, wherein said memory cell comprises access transistors which are respectively connected with said bit lines, and
a difference between the precharge voltage and said power supply voltage is smaller than threshold voltages of said access transistors.

14. The accessing method according to claim 12, wherein said power supply voltage is equal to a voltage in activation of a word line connected with said memory cell.

15. The accessing method according to claim 12, further comprising:
writing a data in said memory cell;
deactivating a word line connected with said memory cell and activated;
supplying the precharge voltage to said bit lines; and
increasing the precharge voltage to the power supply voltage for a preset time.

* * * * *